(12) United States Patent
Ho et al.

(10) Patent No.: US 6,693,006 B2
(45) Date of Patent: Feb. 17, 2004

(54) METHOD FOR INCREASING AREA OF A TRENCH CAPACITOR

(75) Inventors: Hsin-Jung Ho, Shijr (TW); Chang Rong Wu, Banchiau (TW); Yi-Nan Chen, Taipei (TW); Tung-Wang Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 91 days.

(21) Appl. No.: 10/322,111

(22) Filed: Dec. 17, 2002

(65) Prior Publication Data

US 2003/0153158 A1 Aug. 14, 2003

(30) Foreign Application Priority Data

Dec. 21, 2001 (TW) ........................................ 90131940 A

(51) Int. Cl.[7] ........................................... H01L 21/8242
(52) U.S. Cl. ........................ 438/243; 438/386; 438/736
(58) Field of Search ........................ 438/238, 243–249, 438/386–392, 735–744

(56) References Cited

U.S. PATENT DOCUMENTS 6,140,175 A * 10/2000 Kleinhenz et al. .......... 438/243
6,426,254 B2 * 7/2002 Kudelka et al. ............ 438/246
6,458,647 B1 * 10/2002 Tews et al. ................. 438/246

* cited by examiner

Primary Examiner—Thanh T. Nguyen
(74) Attorney, Agent, or Firm—Nelson A. Quintero

(57) ABSTRACT

A method for increasing area of a trench capacitor. First, a first oxide layer and a first nitride layer are sequentially formed on a substrate. An opening is formed through the first oxide layer and the first nitride layer into the substrate. A part of the first oxide layer exposed in the opening is removed to form a first recess, and then a second nitride layer is formed therein. A second oxide layer is formed in the lower portion of the opening. After a third nitride layer is formed in the upper portion of the opening, the second oxide layer is removed. The substrate in the opening is etched using the first nitride layer, the second nitride layer and the third nitride layer as a mask to form a second recess in the lower portion of the opening. The second nitride layer and the third nitride layer are then removed.

6 Claims, 7 Drawing Sheets

METHOD FOR INCREASING AREA OF A TRENCH CAPACITOR

BACKGROUND OF THE INVENTION

1. Field of the Invention

The present invention relates in general to a method for increasing the area of the trench capacitor for dynamic recess random memory (DRAM). In particular, the present invention relates to a method for increasing the area of the trench capacitor using nitride refill.

2. Description of the Related Art

DRAM is used to store data by the charging state of the memory cell. If the capacitors of DRAM can store more charges, that is, the capacitors have higher capacitance, the noise effect, such as soft errors from a particles, occurring in data reads, can be effectively reduced, as is the refresh frequency. In other words, the higher the capacitance, the more stable the data stored in the memory. Therefore, improving the capacitance of the capacitor is an important topic for research.

SUMMARY OF THE INVENTION

A method for increasing area of a trench capacitor is provided. First, a first oxide layer and a first nitride layer are sequentially formed on a substrate. An opening is formed through the first oxide layer and the first nitride layer into the substrate to expose the first oxide layer and the substrate, wherein the opening has a lower portion and an upper portion. A part of the first oxide layer exposed in the opening is removed to form a first recess between the first nitride layer and the substrate. A second nitride layer is formed in the first recess between the first nitride layer and the substrate. A second oxide layer is formed on the first nitride layer and the opening. The second oxide layer in the upper portion of the opening is removed. A third nitride layer is formed in the upper portion of the opening. The second oxide layer in the lower portion of the opening is removed. The substrate in the opening is etched using the first nitride layer, the second nitride layer and the third nitride layer as a mask to form a second recess in the substrate in the lower portion of the opening. The second nitride layer and the third nitride layer are removed.

According to the present invention, the area of the capacitor is increased; therefore, the capacitance of the capacitor is also improved. The nitride refill step is introduced after forming the first recess between the first nitride layer and the substrate in the opening, hence the first oxide layer cannot be undercut, that is, the pad oxide layer and the etching solution used to enlarge the surface area of the lower portion of the opening provide numerous options.

BRIEF DESCRIPTION OF THE DRAWINGS

The preferred embodiment of the invention is hereinafter described with reference to the accompanying drawings in which.

Figure 1A:
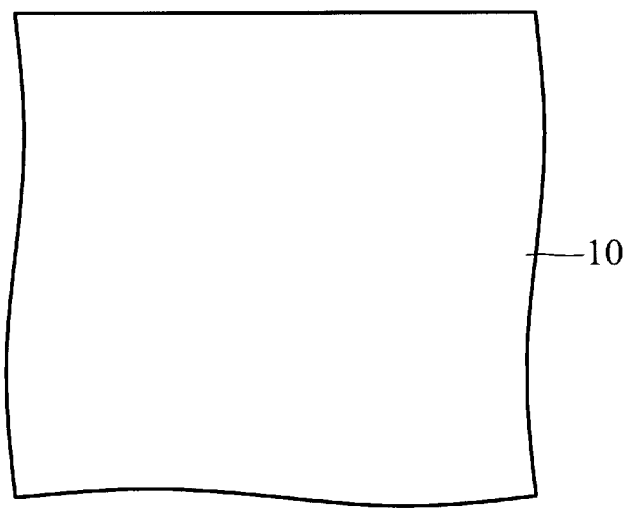
FIGS. 1A to 1N, are cross-sections showing the manufacturing steps of increasing the area of the trench capacitor in accordance with the embodiment of the invention.
Figure 1B:
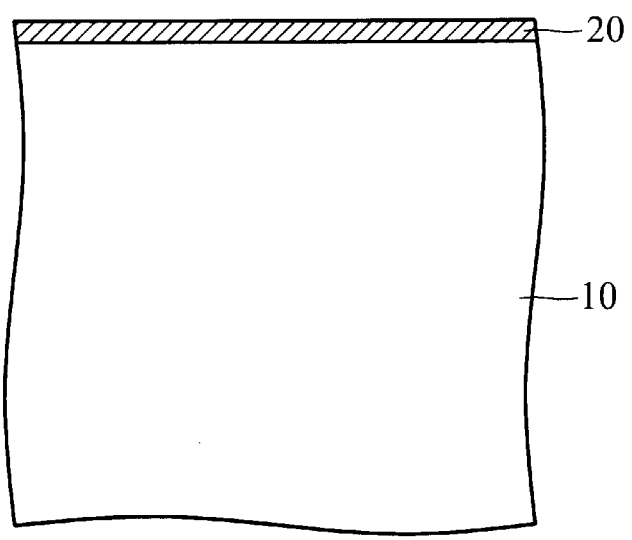
Figure 1C:
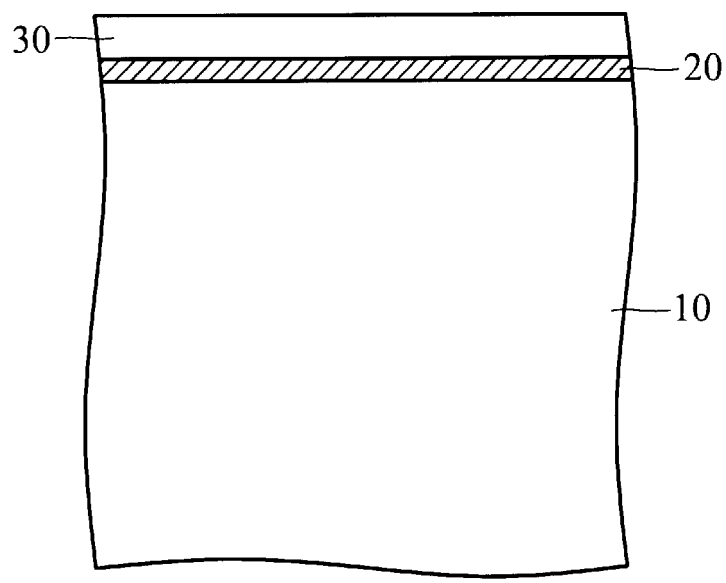
Figure 1D:
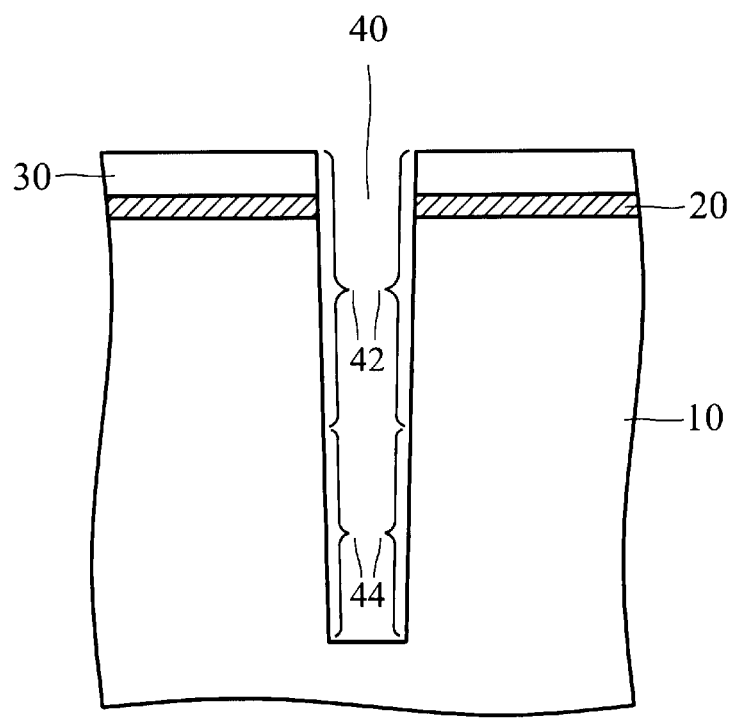

DETAILED DESCRIPTION OF THE INVENTION oxide layer 20 is formed on the surface of the substrate 10, as shown in FIG. 1B. A first nitride layer 30 is formed on the surface of the first oxide layer 20. The substrate 10 can be silicon, the first oxide layer 20 can be silicon oxide ($SiO_2$), and the first nitride layer 30 can be silicon nitride ($Si_3N_4$) Referring to FIG. 1D, an opening 40 is formed through the first nitride layer 30 and the first oxide layer 20 into the substrate 10. The first oxide layer 20 is therefore exposed in the opening 40. The opening 40 comprises a lower portion 44 and an upper portion 42.

Figure 1E:
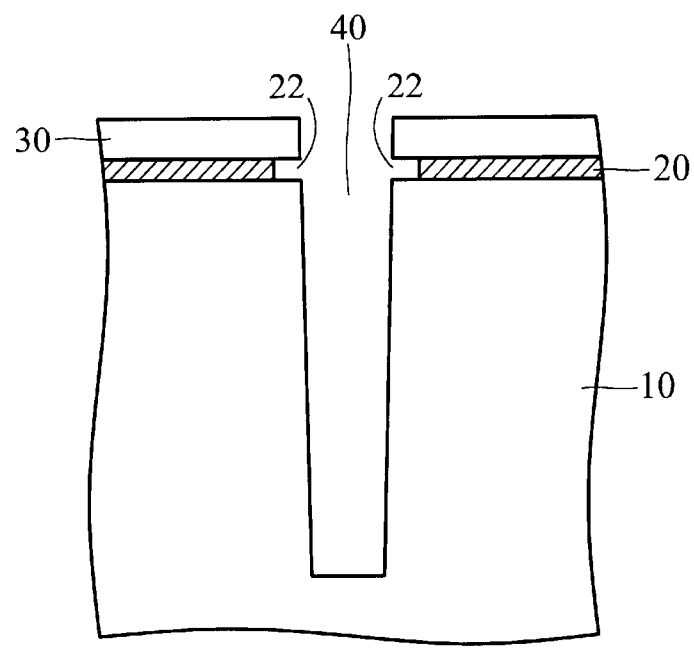
Figure 1F:
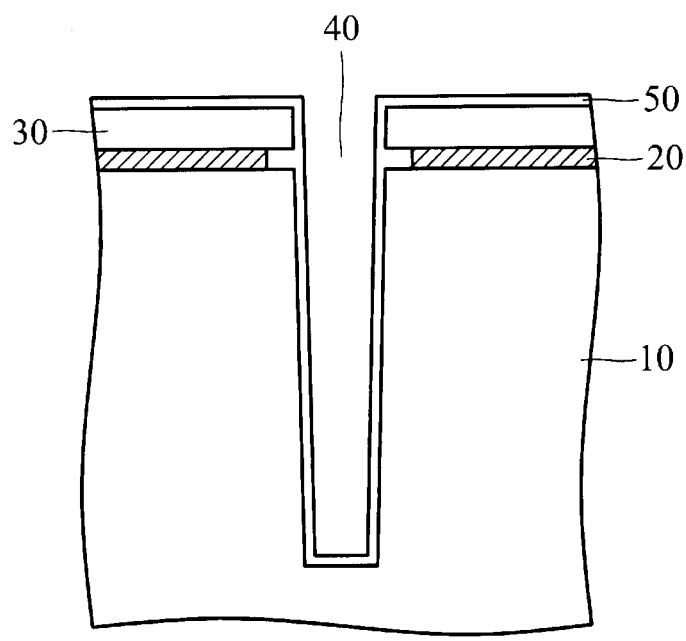
Figure 1G:
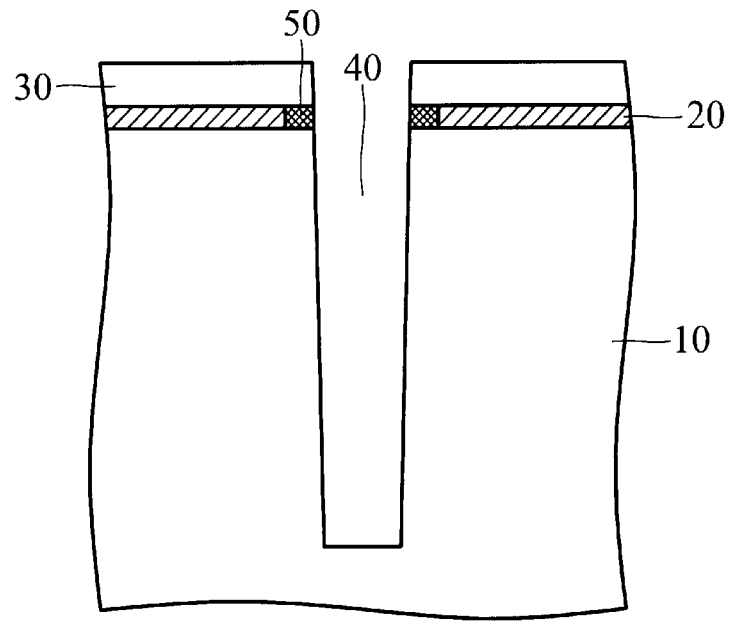

Referring to FIG. 1E, a part of the first oxide layer 20 exposed in the opening 40 is removed to form a first recess 22 between the first nitride layer 30 and the substrate 10. A second nitride layer 50 is substantially conformally formed on the first nitride layer 30 and the opening 40 to fill the first recess 22 between the first nitride layer 30 and the substrate 10, as shown in FIG. 1F. The second nitride layer 50 is then removed to leave the remained nitride layer 50 filling in the recess 22, as shown in FIG. 1G. The above-mentioned first oxide layer 20 is used for pad oxide. The nitride refill step, forming the nitride layer 50 to fill the recess 22, prevents the pad oxide layer 20 from being undercut in the subsequent etching step.

Figure 1H:
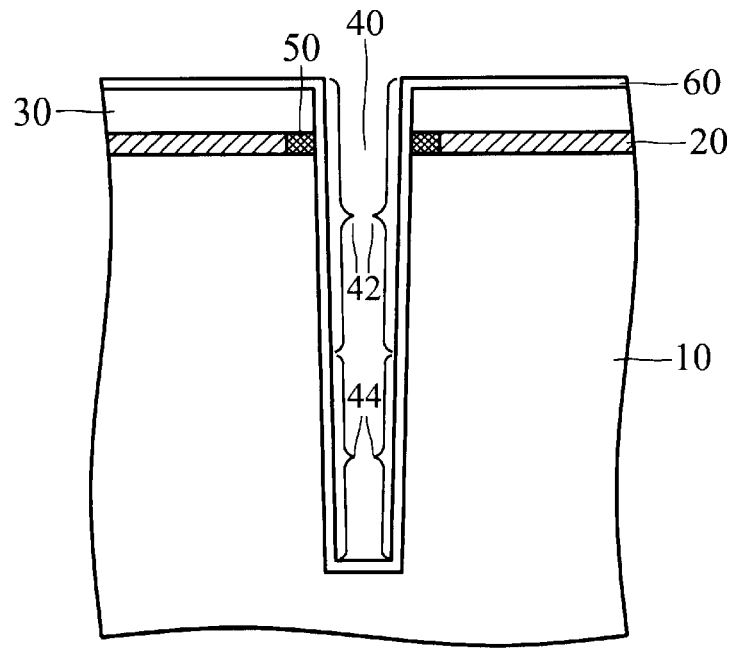
Figure 1I:
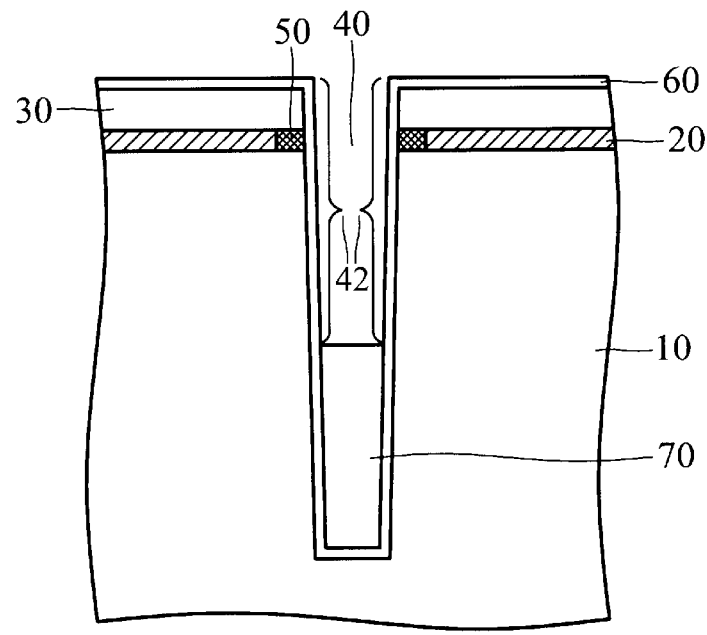
Figure 1J:
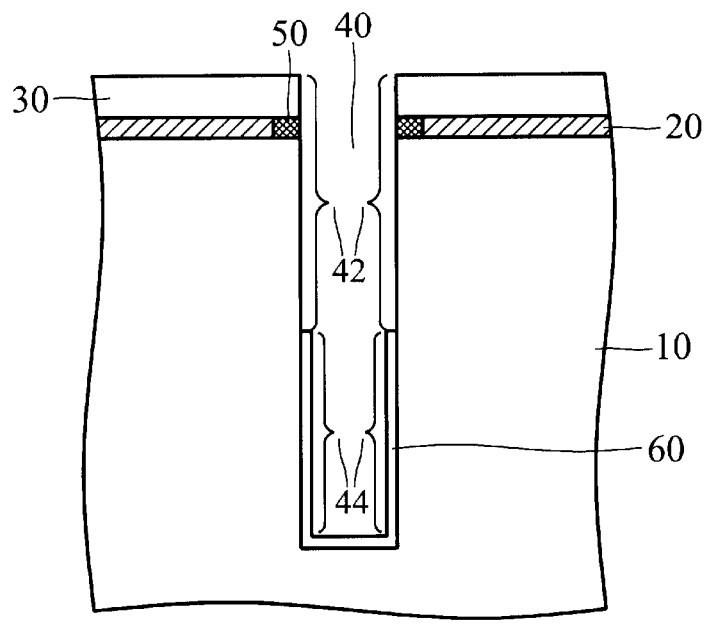
Figure 1K:
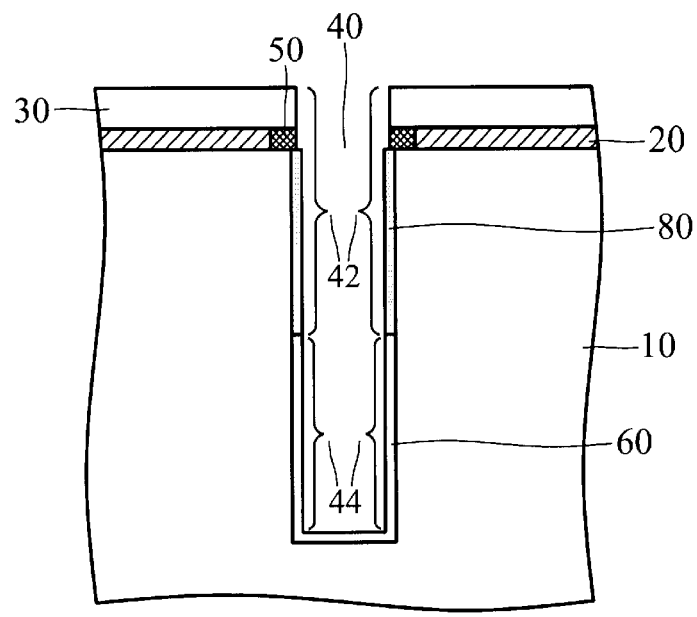

Referring to FIG. 1H, a second oxide layer 60 is formed on the first nitride layer 30 and the opening 40. A photoresist layer 70 is then formed in the lower portion 44 of the opening 40, as shown in FIG. 1I. The second oxide layer 60 can be formed by TEOS-$O_3$ CVD. The second oxide layer 60, without covering the photoresist layer 70, is etched using the photoresist layer 70 as etching mask, as shown in FIG. 1J. A third nitride layer 80 is formed on the upper portion 42 of the opening 40, as shown in FIG. 1K.

Figure 1L:
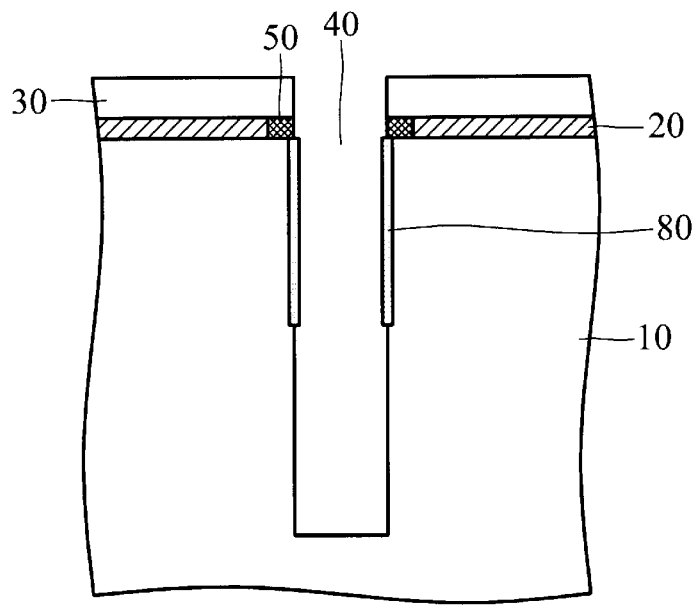
Figure 1M:
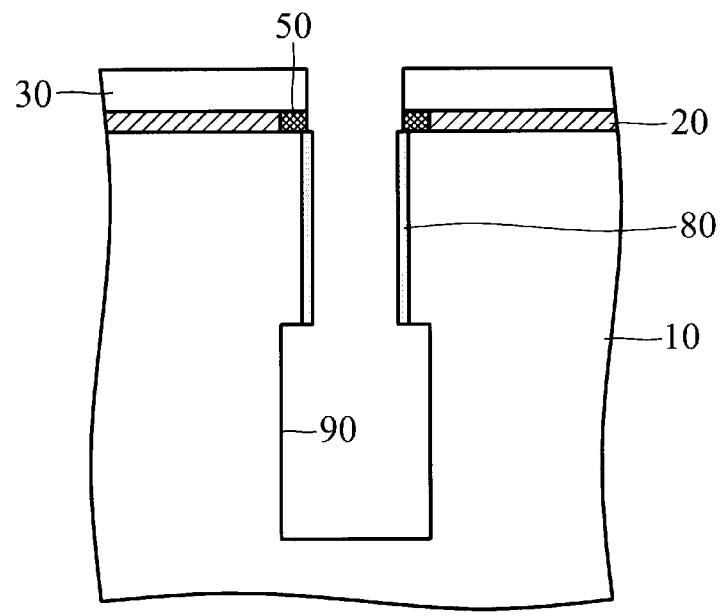

Referring to FIG. 1L, the second oxide layer 60 in the lower portion 44 of the opening 40 is then removed. An etching step is performed using the first nitride layer 30, the second nitride layer 50 and third nitride layer 80 as an etching mask to form a second recess 90 in the substrate 10 exposed in the opening 40, as shown in FIG. 1M. The etching step can be performed using $NH_4OH$ solution. After the etching step, a roughing step is performed using $H_2O_2$ solution and diluted HF solution by turns to increase the roughness of the second recess 90.

Figure 1N:
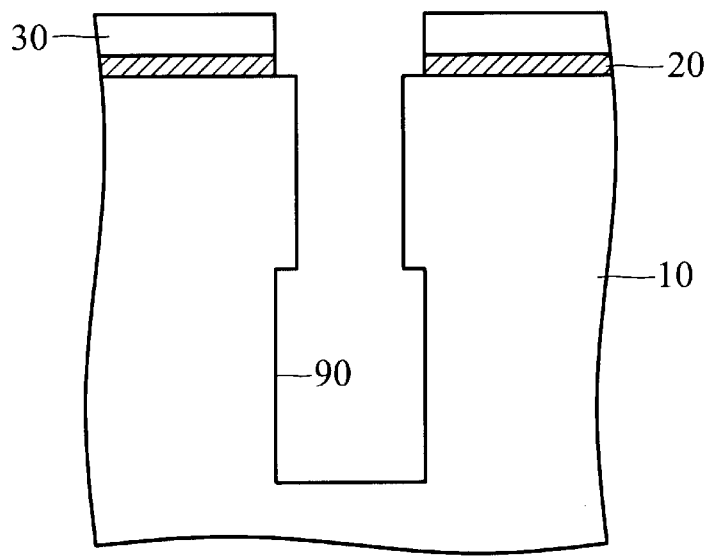

Referring to FIG. 1N, the second nitride layer 50 and the third nitride layer 80 are etched by, for example, HF solution.

The second oxide layer 60 is silicon oxide ($SiO_2$), and the second and third nitride layers 50 and 80 are silicon nitride ($Si_3N_4$).

According to the present invention, the area of the capacitor is increased; therefore, the capacitance of the capacitor is also improved. The nitride refill step is introduced after forming the first recess between the first nitride layer and the substrate in the opening, hence the first oxide layer cannot be undercut, that is, the pad oxide layer and the etching solution used to enlarge the surface area of the lower portion of the opening provide numerous options.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for increasing area of a trench capacitor, comprising:

provide a substrate;

forming a first oxide layer on the substrate;

forming a first nitride layer on the first oxide layer;

forming an opening through the first oxide layer and the first nitride layer into the substrate to expose the first oxide layer and the substrate, wherein the opening has a lower portion and an upper portion;

removing a part of the first oxide layer exposed in the opening to form a first recess between the first nitride layer and the substrate;

forming a second nitride layer in the first recess between the first nitride layer and the substrate;

forming a second oxide layer on the first nitride layer and the opening;

removing the second oxide layer from the upper portion of the opening;

forming a third nitride layer on the upper portion of the opening;

removing the second oxide layer from the lower portion of the opening;

etching the substrate in the opening using the first nitride layer, the second nitride layer and the third nitride layer as a mask to form a second recess in the substrate in the lower portion of the opening; and removing the second nitride layer and the third nitride layer.

2. The method as claimed in claim 1, wherein the substrate in the opening is etched by $NH_4OH$ solution.

3. The method as claimed in claim 1, wherein after the etching step, a roughing step is performed using $H_2O_2$ solution and diluted HF solution by turns.

4. The method as claimed in claim 1, wherein the substrate is a silicon substrate.

5. The method as claimed in claim 1, wherein the first, second and third oxide layers are silicon oxide ($SiO_2$).

6. The method as claimed in claim 1, wherein the first, second and third nitride layers are silicon nitride ($Si_3N_4$).

\* \* \* \* \*